United States Patent
Hu (10) Patent No.: US 10,236,393 B2
(45) Date of Patent: Mar. 19, 2019

(54) TFT, METHOD FOR DRIVING THE SAME, ARRAY SUBSTRATE AND DISPLAY DEVICE

(71) Applicant: BOE TECHNOLOGY GROUP CO., LTD., Beijing (CN)

(72) Inventor: Hehe Hu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/542,298

(22) PCT Filed: Sep. 23, 2016

(86) PCT No.: PCT/CN2016/099804
§ 371 (c)(1),
(2) Date: Jul. 7, 2017

(87) PCT Pub. No.: WO2017/118103
PCT Pub. Date: Jul. 13, 2017

(65) Prior Publication Data
US 2018/0269332 A1 Sep. 20, 2018

(30) Foreign Application Priority Data
Jan. 5, 2016 (CN) .......................... 2016 1 0005855

(51) Int. Cl.
*H01L 29/00* (2006.01)
*H01L 29/786* (2006.01)
(Continued)

(52) U.S. Cl.
CPC ......... *H01L 29/78696* (2013.01); *G09G 3/20* (2013.01); *H01L 27/1214* (2013.01);
(Continued)

(58) Field of Classification Search
CPC ................................................. H01L 27/1214
See application file for complete search history.

(56) References Cited

U.S. PATENT DOCUMENTS

2003/0015703 A1* 1/2003 Yamazaki ......... G02F 1/136227
257/66
2008/0105874 A1 5/2008 Wang et al.
(Continued)

FOREIGN PATENT DOCUMENTS

CN 1595662 A 3/2005
CN 101005082 A 7/2007
(Continued)

OTHER PUBLICATIONS

Office Action received for Chinese Patent Application No. 201610005855.2, dated Jan. 29, 2018, 12 pages (6 pages of English Translation and 6 pages of Office Action).
(Continued)

*Primary Examiner* — William Harriston
(74) *Attorney, Agent, or Firm* — Womble Bond Dickinson (US) LLP (57) ABSTRACT

A TFT, a method for driving TFT, an array substrate, and a display device are disclosed. The TFT comprises a first gate on a base plate, an active layer insulated from the first gate, a source and a drain, and a second gate arranged on a side of the active layer away from the first gate and insulated from the active layer. The second gate comprises at least two sub-gates. An orthographic projection of each sub-gate overlaps that of a channel region. The first gate is capable of controlling the complete channel region, and the second gate is capable of controlling a portion of the channel region. The first and second gates maintain an energy band of the channel region at a relatively stable state, and thus maintain stable switching characteristics. This increases reliability and electrical performance of TFT.

2 Claims, 4 Drawing Sheets

(51) Int. Cl.
*H01L 29/423* (2006.01)
*G09G 3/20* (2006.01)
*H01L 27/12* (2006.01)
*H01L 29/66* (2006.01)

(52) U.S. Cl.
CPC ...... *H01L 29/423* (2013.01); *H01L 29/42384* (2013.01); *H01L 29/66742* (2013.01); *H01L 29/786* (2013.01); *H01L 29/7869* (2013.01); *G09G 2300/0426* (2013.01); *G09G 2310/02* (2013.01)

(56) References Cited

U.S. PATENT DOCUMENTS

2008/0246720 A1 10/2008 Lee et al.
2015/0179774 A1 6/2015 Yamazaki et al.

FOREIGN PATENT DOCUMENTS

| CN | 101281334 A | 10/2008 |
| CN | 204243045 U | 4/2015 |
| CN | 105633136 A | 6/2016 |

OTHER PUBLICATIONS

International Search Report and Written Opinion in PCT/CN2016/099804 dated Jan. 3, 2017, with English translation.

* cited by examiner

TFT, METHOD FOR DRIVING THE SAME, ARRAY SUBSTRATE AND DISPLAY DEVICE

RELATED APPLICATIONS

The present application is the U.S. national phase entry of PCT/CN2016/099804, with an international filing date of Sep. 23, 2016, which claims the benefit of Chinese Patent Application 201610005855.2, filed on Jan. 5, 2016, the entire disclosures of which are incorporated herein by reference.

TECHNICAL FIELD

The present disclosure relates to the field of display technology, and particularly to a Thin-film Transistor (TFT), a method for driving the same, an array substrate, and a display device.

BACKGROUND

During production of a display panel, the TFT plays an important role on an array substrate. The TFT generally comprises a gate which is arranged on a base plate, an active layer which is arranged on the gate and is insulated from the gate, and a source and a drain which are arranged oppositely and electrically connected with the active layer, respectively. When a current is applied to the gate through a circuit on the base plate, the current which is applied to the source is transported to the drain through the active layer, and pixel units of the display device are drove to display an image. Currently the TFT has a poor reliability, so that the electrical performance of TFT is not stable.

SUMMARY

Embodiments of the present disclosure intend to solve one or more the above mentioned technical problem or other technical problems.

Therefore, an embodiment of the present disclosure provides a TFT, comprising a first gate which is arranged on a base plate, an active layer which is insulated from the first gate, and a source and a drain which are arranged oppositely and electrically connected with the active layer, respectively; wherein the TFT further comprises a second gate which is arranged on a side of the active layer away from the first gate and is insulated from the active layer, the second gate comprises at least two sub-gates, and an orthographic projection of each of the sub-gates on the base plate overlaps an orthographic projection of a channel region the base plate.

In the TFT of the present embodiment, the first gate is capable of controlling the complete channel region, and the second gate is capable of controlling a portion of the channel region. The first gate and the second gate maintain an energy band of the channel region of the TFT at a relatively stable state, and thus maintain stable switching characteristics of the TFT. This effectively increases reliability of the TFT, and ensures excellent electrical performance of the TFT.

In a possible implementation, each of the sub-gates extends in a direction which intersects a direction from the source to the drain.

In a possible implementation, during each time period in which the first gate is not loaded with an ON signal, at least two of the sub-gates are loaded with signals of opposite polarities; and during two neighboring time periods in which the first gate is not loaded with the ON signal, a same one of the sub-gates is loaded with signals of opposite polarities.

In a possible implementation, the second gate comprises a plurality of sub-gates which are arranged in pairs; and during each time period in which the first gate is not loaded with the ON signal, each of the sub-gates is loaded with signals of alternating positive and negative polarities.

In a possible implementation, an overlapping region between the orthographic projection of each of the sub-gates on the base plate and the orthographic projection of the channel region of the TFT on the base plate has a same area.

In a possible implementation, a length of each of the sub-gates in a direction perpendicular to the direction from the source to the drain is larger than or equal to a width of the channel region.

In a possible implementation, an interval between the sub-gates is larger than or equal to 1 μm.

In a possible implementation, the sub-gates are uniformly spaced.

In a possible implementation, the active layer comprises an oxide semiconductor.

In a possible implementation, the first gate is arranged above the active layer, and the second gate is arranged below the active layer.

In a possible implementation, the first gate is arranged below the active layer, and the second gate is arranged above the active layer.

An embodiment of the present disclosure further provides an array substrate, comprising the TFT as described above.

An embodiment of the present disclosure further provides a display device, comprising the array substrate as described above.

An embodiment of the present disclosure further provides a method for driving the TFT as described above, comprising:

during each time period in which the first gate is loaded with the ON signal, loading each of the sub-gates of the second gate with no signal; and during each time period in which the first gate is not loaded with the ON signal, loading at least two of the sub-gates with signals of opposite polarities, and during two neighboring time periods in which the first gate is not loaded with the ON signal, loading a same one of the sub-gates with signals of opposite polarities.

In a possible implementation, during each time period in which the first gate is not loaded with the ON signal, loading at least two of the sub-gates with signals of opposite polarities, comprises: during each time period in which the first gate is not loaded with the ON signal, loading each of the sub-gates with signals of alternating positive and negative polarities.

DETAILED DESCRIPTION OF EMBODIMENTS

Specific embodiments of a TFT, a method for driving the TFT, an array substrate, and a display device will be further described hereinafter with reference to the drawings and embodiments. The shapes and sizes of components in the drawings are not drawn in a true scale of TFT, and only intend to illustrate the content of the present disclosure.

Reference numerals: 1 base plate; 2 first gate; 3 active layer; 4 source; 5 drain; 6 second gate; 61 first sub-gate; 62 second sub-gate; 01 portion of channel region controlled by first sub-gate; 02 portion of channel region controlled by second sub-gate; 03 complete channel region controlled by first gate control; 04 carrier.

When a display panel is operating, a gate line driver device switches on gate line switches in a progressive way. Therefore, gate lines in a line most of the time are switched off, i.e., are subject to a negative biasing voltage. In case the TFT has been driven by the gate lines for a long time, the threshold voltage of TFT may drift, which affects the operating stability and reduces reliability of TFT. Furthermore, in an oxide TFT, an oxide semiconductor with high carrier mobility is generally adopted as a material for the active layer. In the existing TFT structure, a gate of a metallic material can only block light ray on a side of the active layer. The light from the back light source, or the external light may be reflected at the source/drain interface, i.e., reflected between the source/drain and the gate. When the reflected light irradiates the oxide active layer, the material of the oxide active layer is not stable so that it generates photo current upon light irradiation. As a result, when the oxide TFT is switched on, the threshold voltage drifts. This leads to that the reliability of the oxide TFT decreases, the electrical performance is not stable, and the display quality is affected.

Figure 1:
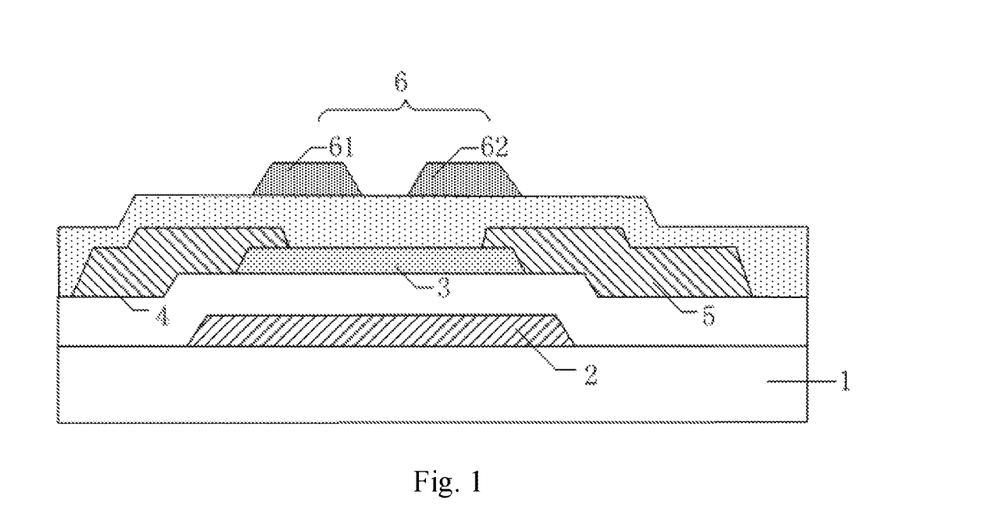
FIG. 1 and FIG. 2 are structural diagrams for illustrating a TFT in an embodiment of the present disclosure, respectively.
Figure 2:
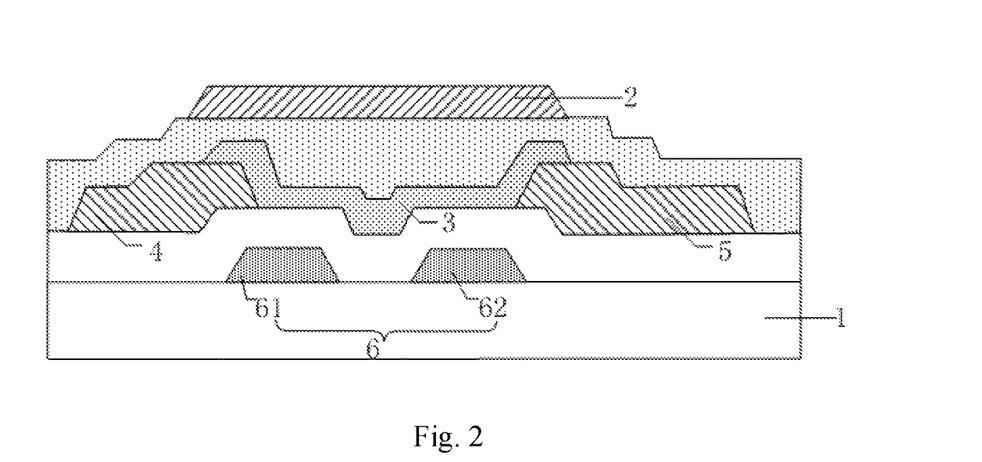

An embodiment of the present disclosure provides a TFT. As shown in FIG. 1 and FIG. 2, the TFT comprises a first gate 2 which is arranged on a base plate 1, an active layer 3 which is insulated from the first gate, and a source 4 and a drain 5 which are arranged oppositely and electrically connected with the active layer 3, respectively.

The TFT further comprises a second gate 6 which is arranged on a side of the active layer 3 away from the first gate 2 and is insulated from the active layer 3. The second gate 6 comprises at least two sub-gates. An orthographic projection of each of the sub-gates on the base plate 1 overlaps an orthographic projection of a channel region of the TFT on the base plate 1.

In the above TFT in an embodiment of the present disclosure, the first gate and the second gate are provided in the TFT. The first gate is equivalent to a gate in the existing TFT. The orthographic projection of the first gate on the base plate covers the channel region of the TFT. Namely, the first gate is capable of controlling the complete channel region. The orthographic projection of each of the sub-gates of the second gate on the base plate overlaps the orthographic projection of the channel region of the TFT on the base plate. Namely, the second gate is capable of controlling a portion of the channel region. In embodiments of the present disclosure, the first gate and the second gate are loaded with corresponding signals to control the state of the energy band of the channel region of TFT, to maintain the energy band at a relatively stable state, and thus maintain stable switching characteristics of the TFT. This effectively increases reliability of the TFT, and ensures the TFT has excellent electrical performance.

In embodiments of the present disclosure, each of the sub-gates extends in a direction which for example intersects a direction from the source to the drain. The term "intersect" as used herein refers to "not parallel with". This ensures that each of the sub-gates is capable of effectively controlling a portion of the channel region. For example, in order to simplify the layout of each of the sub-gates, each of the sub-gates extends in a direction perpendicular to the direction from the source to the drain.

In embodiments of the present disclosure, as shown in FIG. 1, the first gate 2 is arranged below the active layer 3, and the second gate 6 is arranged above the active layer 3. Alternatively, as shown in FIG. 2, the first gate 2 is arranged above the active layer 3, and the second gate 6 is arranged below the active layer 3.

In embodiments of the present disclosure, the first gate and the second gate are loaded with signals in various manners. For purpose that the first gate and the second gate are capable of controlling the state of the energy band of the channel region of TFT and maintain it at a relatively stable state, for example, during each time period in which the first gate is not loaded with an ON signal, at least two sub-gates in the second gate are loaded with signals of opposite polarities, and during two neighboring time periods in which the first gate is not loaded with the ON signal, a same one of the sub-gates is loaded with signals of opposite polarities.

It is noted that when the first gate is loaded with the ON signal, the TFT is switched on, and when the first gate is not loaded with the ON signal, the TFT is switched off. Each time the TFT is switched off, at least two sub-gates are loaded with signals of opposite polarities. Namely, at least one of the sub-gates is loaded with a negative voltage signal, and at least one of the sub-gates is loaded with a positive voltage signal. In this case, the TFT stays in the OFF state, as long as one of the sub-gates is loaded with the negative voltage signal. When the TFT stays in the OFF state for two neighboring times, the positive signal on a same one of the sub-gates switches to the negative signal, or vice versa.

Furthermore, in embodiments of the present disclosure, in case the second gate comprises a plurality of sub-gates which are arranged in pairs, during each time period in which the first gate is not loaded with the ON signal, each of the sub-gates is loaded with signals of alternating positive and negative polarities.

Figure 3A:
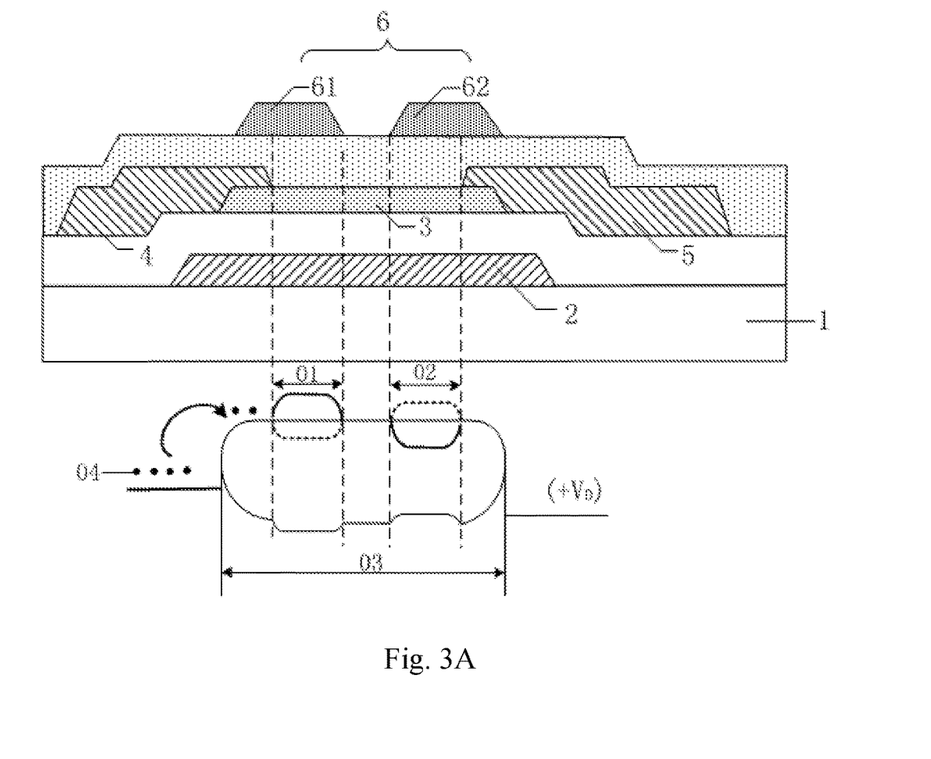
FIG. 3a and FIG. 3b are schematic views for illustrating an energy band of a TFT in operation in an embodiment of the present disclosure, respectively.
Figure 3B:
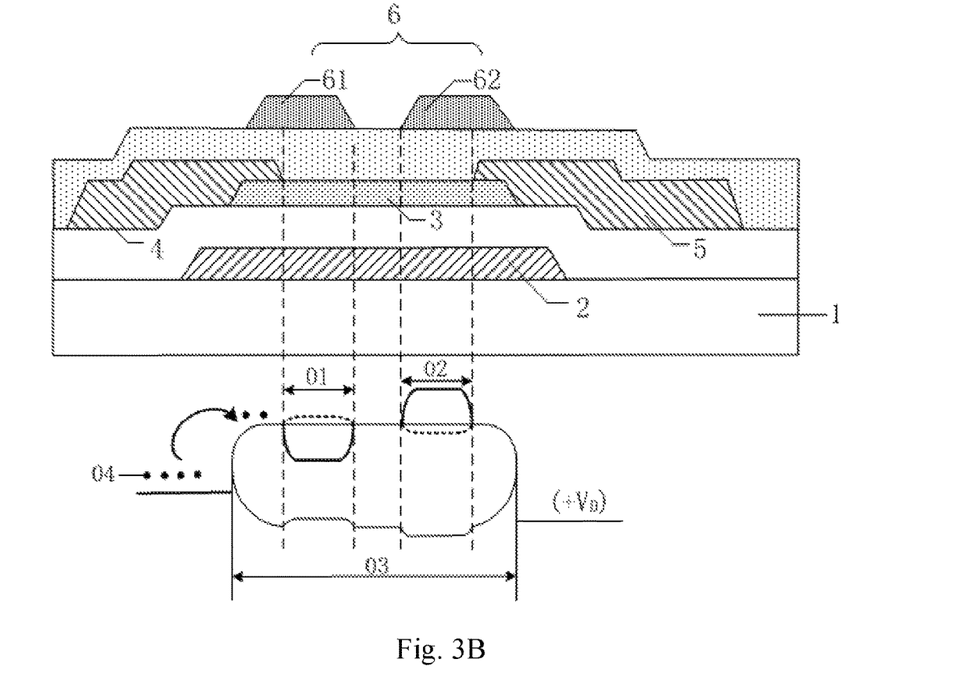

In particular, as shown in FIG. 3a and FIG. 3b, the second gate 6 comprises two sub-gates, i.e., a first sub-gate 61 and a second sub-gate 62. The principle in which the stability of the TFT is increased in the present disclosure will be further explained with reference to signals with which the first gate 2, the first sub-gate 61 and the second sub-gate 62 are loaded during different time periods.

As shown in FIG. 3a, the first sub-gate 61 is loaded with the negative voltage signal, and the second sub-gate 62 is loaded with the positive voltage signal. In this case, a portion of the channel region 01 controlled by the first sub-gate 61 forms an energy barrier. This energy barrier hinders movement of carriers 04 which are transported from the source 4, so that the TFT is in the OFF state.

In case the first sub-gate 61 has been loaded with a negative voltage signal for a long time and irradiated by light, the energy band of the portion of the channel region 01 controlled by the first sub-gate 61 bends downwards (as shown by a dotted line in FIG. 3a). In case the second sub-gate 62 has been loaded with the positive voltage signal for a long time, the energy band of a portion of the channel region 02 controlled by the second sub-gate 62 bends upwards.

The second gate 6 is not loaded with the signal, and the first gate 2 is loaded with the ON signal. When the energy band of the portion of the channel region 02 controlled by the second sub-gate 62 bends to lower than the carrier energy level of the source 4, due to the ON signal of the first gate 2, the TFT is in the ON state, and carriers 04 of the source 4 are transported to the drain 5 through the complete channel region 03 controlled by the first gate 2 control.

The first gate 2 is not loaded with the signal, and the second gate 6 is loaded with the signal again. At this time, the first sub-gate 61 is loaded with the positive voltage signal, and the second sub-gate 62 is loaded with the negative voltage signal. As shown in FIG. 3b, the portion of the channel region 02 controlled by the second sub-gate 62 forms an energy barrier. The energy barrier hinders movement of carriers 04 which are transported from the source 4, while the TFT is still in the OFF state.

In case the first sub-gate 61 has been loaded with the positive voltage signal for a long time, the energy band of the portion of the channel region 01 controlled by the first sub-gate 61 bends upwards from the dotted line in FIG. 3a. Since the energy band of this portion of the channel region 01 in FIG. 3a offsets downwards with respect to the initial position. This offset partially counteracts the upwards bending of the energy band. Therefore, the bending position of the energy band of the portion of the channel region 01 has a small offset with respect to the initial state, as shown by a dotted line at the right side of FIG. 3b.

In case the second sub-gate 62 has been loaded with the negative voltage signal for a long time and irradiated by light, the energy band of the portion of the channel region 02 controlled by the second sub-gate 62 bends downwards from the dotted line in FIG. 3a. Similarly, the bending position of the portion of the channel region 02 has a small offset with respect to the initial state, as shown by the dotted line at the right side of FIG. 3b.

Therefore, by repeating the above alternating processes, it is ensured that the state of the energy band of the channel region of TFT is maintained at a relatively stable state, so that the switching characteristics of the TFT are stable. This significantly increases the stability of TFT during operation of the display module.

It is noted that the first gate and the second gate are loaded with signals in various manners. The manner for loading signals is not limited to the embodiment as described above, as long as it is ensured that the TFT has stable switching characteristics.

Figure 4:
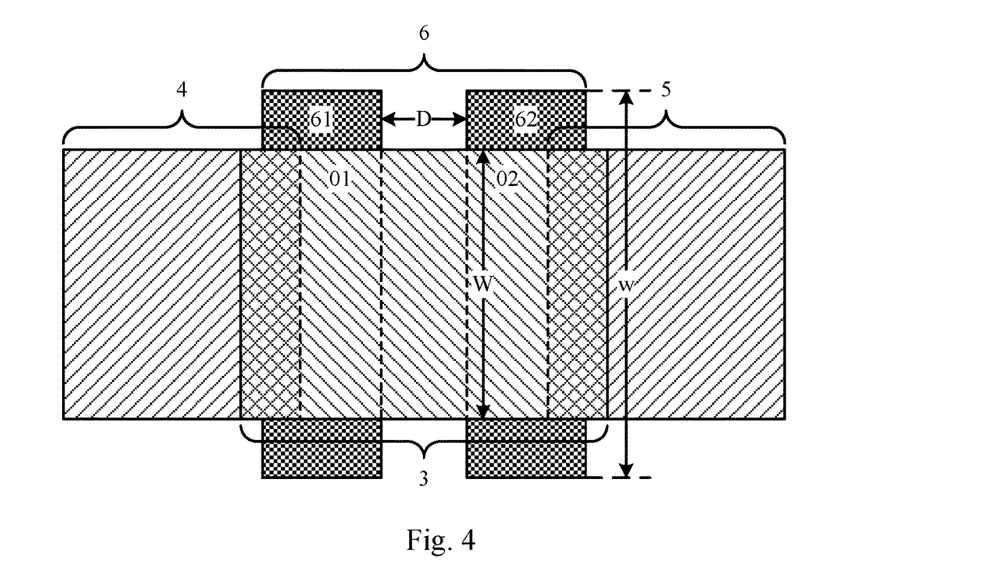
FIG. 4 is a top view for illustrating a TFT in an embodiment of the present disclosure.

In embodiments of the present disclosure, for purpose that each of the sub-gates plays a same role in controlling the respective portion of the channel region, the overlapping region between the orthographic projection of each of the sub-gates on the base plate and the orthographic projection of the channel region optionally has a same area. Namely, the portion of the channel region controlled by each of the sub-gates has a same area. As shown in FIG. 4, the portion of the channel region 01 controlled by the first sub-gate 61 (as shown by the dotted line at the left side) and the portion of the channel region 02 controlled by the second sub-gate 62 (as shown by the dotted line at the right side) have a same area. In FIG. 4, the grid region at the left side indicates the overlapping region between the orthographic projection of the active layer 3 on the base plate and the orthographic projection of the source 4 on the base plate, and the grid region at the right side indicates the overlapping region between the orthographic projection of the active layer 3 on the base plate and the orthographic projection of the drain 5 on the base plate.

In embodiments of the present disclosure, in order to further effectively control a portion of the channel region, as shown in FIG. 4, a length w of each of the sub-gates in a direction perpendicular to the direction from the source to the drain is larger than or equal to a width W of the channel region, i.e., w≥W.

In embodiments of the present disclosure, in order to reduce the short channel effect, an interval D between sub-gates is larger than or equal to 1 μm, as shown in FIG. 4.

Furthermore, in embodiments of the present disclosure, the sub-gates are uniformly spaced.

In embodiments of the present disclosure, the active layer for example comprises an oxide semiconductor like indium gallium zinc oxide (IZGO). Even if the oxide TFT is irradiated by light, the threshold voltage of the oxide TFT when switched on would not drift, and this increases the reliability of oxide TFT.

In embodiments of the present disclosure, the TFT generally further comprises other films or structures, such as a gate insulating layer, a passivation layer. These films or structures can be realized in various manners, which are not repeated here for simplicity.

A method for fabricating the TFT shown in FIG. 1 will be described hereinafter in detail with reference to a specific embodiment. In particular, the method comprises the following steps.

Step a, a pattern of the first gate is formed on a base plate.

In implementations, a metallic film is deposited on the base plate. The metallic film comprises for example Al, Cu, Mo, or other metallic materials. The metallic film is patterned to form the pattern of the first gate;

Step b, a pattern comprising a gate insulating layer and an active layer is formed on the first gate pattern.

In implementations, the gate insulating layer comprises for example silicon dioxide, and the active layer comprises for example IZGO. The gate insulating layer is firstly formed on the first gate pattern, and then is patterned to form the pattern of active layer.

Step c, a pattern of source and drain is formed on the active layer pattern.

In implementations, a source/drain metallic layer is deposited on the pattern of the active layer. The source/drain metallic layer comprises for example Cu. The active layer pattern is patterned to form the pattern of source and drain.

Step d, a pattern of passivation layer is formed on the pattern of source/drain and active layer.

In implementations, the passivation layer comprises for example silicon dioxide. A pattern of passivation layer is formed by patterning on the base plate on which the pattern of the source/drain and the active layer has been formed.

Step e, a pattern is formed on the passivation layer.

In implementations, an ITO film is deposited on the passivation layer, and a pattern of each of the sub-gates of the second gate is formed on the passivation layer by patterning. The sub-gates for example have an elongated shape, and at other position the sub-gates are connected with the source and drain to act as pixel electrodes.

To this end, the TFT in an embodiment of the present disclosure is fabricated by the above step a-step e.

On basis of a same inventive concept, an embodiment of the present disclosure further provides a method for driving the above TFT. Since the principle for the method to solve the problem is similar with the TFT, reference is made to embodiments of the TFT for implementations of the method, which are not repeated for simplicity.

Figure 5:
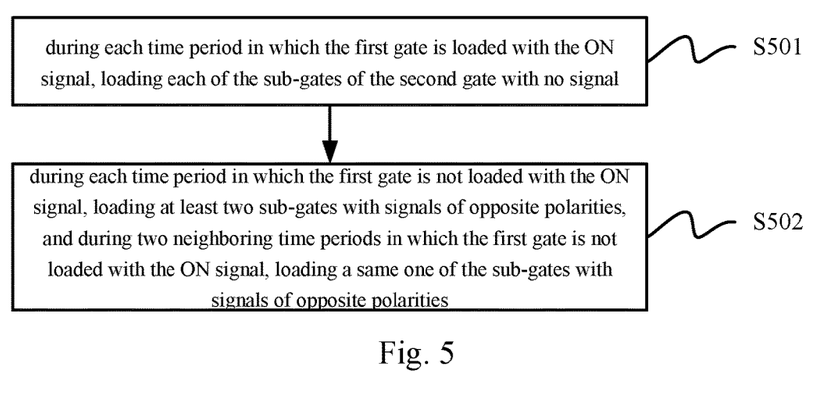
FIG. 5 is a flow chart for illustrating a method for driving a TFT in an embodiment of the present disclosure.

In an embodiment of the present disclosure, as shown in FIG. 5, the method for driving TFT particularly comprise:

S501, during each time period in which the first gate is loaded with the ON signal, loading each of the sub-gates of the second gate with no signal; and S502, during each time period in which the first gate is not loaded with the ON signal, loading at least two sub-gates with signals of opposite polarities, and during two neighboring time periods in which the first gate is not loaded with the ON signal, loading a same one of the sub-gates with signals of opposite polarities.

In an embodiment of the present disclosure, during each time period in which the first gate is not loaded with the ON signal, loading at least two sub-gates with signals of opposite polarities in step S502 for example can be realized by: during each time period in which the first gate is not loaded with the ON signal, loading each of the sub-gates with signals of alternating positive and negative polarities.

In a specific embodiment, the method for driving TFT particularly comprises the following steps.

Step a, when the TFT is in the ON state for the first time, the first gate is loaded with the ON signal, and the first sub-gate and the second sub-gate are not loaded with the signal. At this time, the complete channel region controlled by the first gate is switched on, pixel electrodes receive a voltage signal from the source of TFT, and pixels in the display panel are lighted up.

Step b, when TFT is in the OFF state for the first time, the first gate is not loaded with the ON signal, the first sub-gate is loaded with a negative voltage signal, and the second sub-gate is loaded with the positive voltage signal. At this time, the channel is switched off, the voltage of pixel electrodes is no longer affected by the source voltage and stays in a pixel holding state. A portion of the channel region is affected by the signal loaded to the second gate, and the energy band bends.

Step c, when TFT is in the ON state for a second time, the second gate is not loaded with the signal, and the first gate is loaded with the ON signal. At this time, the complete channel region controlled by the first gate is switched on, pixel electrodes receive the voltage signal from the source, and the pixel signal is refreshed.

Step d, when TFT is in the OFF state for a second time, the first gate is not loaded with the ON signal, the first sub-gate is loaded with the positive voltage signal, and the second sub-gate is loaded with the negative voltage signal. At this time channel is switched off, the voltage of pixel electrodes is no longer affected by the source voltage, and stays in a pixel holding state again. A portion of the channel region is affected by the signal loaded to the second gate, and the energy band bends. This voltage is opposite to the voltage when the TFT is in the OFF state for the first time, the portion of the channel region bends its energy band in the opposite direction, and thus the bending of energy band in the previous time is partially counteracted. In this way, the state of the energy band of the channel region of TFT is recovered.

Then, step a-step d are repeated. In this way, the state of the energy band of the channel region of TFT is maintained at a relatively stable state, so that the switching characteristics of the TFT are stable. This significantly increases the stability of TFT during operation of the display module.

On basis of a same inventive concept, an embodiment of the present disclosure further provides an array substrate, which comprises the TFT in the above embodiments. The pixel electrode in the array substrate is arranged in a same layer as the second gate in the TFT, which reduces fabricating process and saves cost.

On basis of a same inventive concept, an embodiment of the present disclosure further provides a display device, which comprises the above array substrate. The display device for example is a product or component with a display function, such as a mobile phone, a tablet computer, a TV, a monitor, a notebook computer, a digital frame, a navigator. Other essential components of the display device are known for an ordinary skilled person in the art, and are not repeated here for simplicity. Reference is made to embodiments of the TFT and the array substrate for implementations of the display device, which are not repeated for simplicity.

Embodiments of the present disclosure provide a TFT, a method for driving the same, an array substrate, and a display device. The TFT comprises a first gate being arranged on a base plate, an active layer being insulated from the first gate, a source and a drain being arranged oppositely and electrically connected with the active layer, and a second gate being arranged on a side of the active layer away from the first gate and insulated from the active layer. The second gate comprises at least two sub-gates. An orthographic projection of each of the sub-gates on the base plate overlaps an orthographic projection of a channel region the base plate. Since the first gate is capable of controlling the complete channel region, and the second gate is capable of controlling a portion of the channel region, the first gate and the second gate enable to maintain an energy band of the channel region of the TFT at a relatively stable state, and thus maintain stable switching characteristics of the TFT. This effectively increases reliability of the TFT, and ensures excellent electrical performance of the TFT.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A method for driving a TFT, comprising a first gate which is arranged on a base plate, an active layer which is insulated from the first gate, and a source and a drain which are arranged oppositely and electrically connected with the active layer, respectively;
   wherein the TFT further comprises a second gate which is arranged on a side of the active layer away from the first gate and is insulated from the active layer, the second gate comprises at least two sub-gates which are electrically insulated from one another, and an orthographic projection of each of the sub-gates on the base plate overlaps an orthographic projection of a channel region the base plate,
   wherein the method comprises during each time period in which the first gate is loaded with an ON signal, loading each of the sub-gates of the second gate with no signal; and
   during each time period in which the first gate is not loaded with the ON signal, loading at least two of the sub-gates with signals of opposite polarities, and during two neighboring time periods in which the first gate is not loaded with the ON signal, loading a same one of the sub-gates with signals of opposite polarities.

2. The method of claim 1, wherein during each time period in which the first gate is not loaded with the ON signal, loading at least two of the sub-gates with signals of opposite polarities, comprises:

during each time period in which the first gate is not loaded with the ON signal, loading each of the sub-gates with signals of alternating positive and negative polarities.

\* \* \* \* \*